United States Patent
Shanker et al.

(10) Patent No.: US 8,821,987 B2
(45) Date of Patent: Sep. 2, 2014

(54) COMBINATORIAL PROCESSING USING A REMOTE PLASMA SOURCE

(71) Applicant: Intermolecular, Inc., San Jose, CA (US)

(72) Inventors: Sunil Shanker, Santa Clara, CA (US); Tony P. Chiang, Campbell, CA (US); Chi-I Lang, Cupertino, CA (US); Sandip Niyogi, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/717,478

(22) Filed: Dec. 17, 2012

(65) Prior Publication Data

US 2014/0166616 A1 Jun. 19, 2014

(51) Int. Cl.
- H05H 1/00 (2006.01)
- C23C 16/00 (2006.01)
- C23C 16/50 (2006.01)
- B44C 1/22 (2006.01)

(52) U.S. Cl.
CPC ............... *C23C 16/50* (2013.01); *B44C 1/227* (2013.01)
USPC .................. 427/535; 427/248.1; 427/255.23; 427/255.28

(58) Field of Classification Search
None
See application file for complete search history.

(56) References Cited

U.S. PATENT DOCUMENTS

| | | | |
|---|---|---|---|
| 8,153,535 B1 | 4/2012 | Shanker et al. | |
| 8,334,015 B2 * | 12/2012 | Chiang et al. | 427/248.1 |
| 2009/0061083 A1 * | 3/2009 | Chiang et al. | 427/248.1 |
| 2009/0275210 A1 * | 11/2009 | Shanker et al. | 438/761 |
| 2011/0244690 A1 * | 10/2011 | Shanker et al. | 438/703 |
| 2012/0301616 A1 * | 11/2012 | Endo et al. | 427/255.7 |

* cited by examiner

*Primary Examiner* — Timothy Meeks
*Assistant Examiner* — Ina Agaj

(57) ABSTRACT

Methods and apparatus for processing using a remote plasma source are disclosed. The apparatus includes an outer chamber, a remote plasma source, and a showerhead. Inert gas ports within the showerhead assembly can be used to alter the concentration and energy of reactive radical or reactive neutral species generated by the remote plasma source in different regions of the showerhead. This allows the showerhead to be used to apply a surface treatment to different regions of the surface of a substrate. Varying parameters such as the remote plasma parameters, the inert gas flows, pressure, and the like allow different regions of the substrate to be treated in a combinatorial manner.

9 Claims, 6 Drawing Sheets

COMBINATORIAL PROCESSING USING A REMOTE PLASMA SOURCE

TECHNICAL FIELD

The present disclosure relates generally to methods and apparatuses for processing using a remote plasma source for surface treatment and layer formation.

BACKGROUND

Plasmas are widely used for a variety of treatment and layer deposition tasks in semiconductor fabrication and other thin film applications. These applications include subtractive processes such as wafer precleaning, contaminant removal, native oxide removal, photoresist removal, plasma etching, as well as treatment processes such as oxidation, nitridation, or hydridation of a layer both during and after formation. "Remote" plasma sources are frequently used, where the plasma is located at some distance from the surface to be treated or substrate on which a layer is being formed. The distance allows some filtering of the charged particles in the plasma. For example, the density of electrons and ions can be adjusted or removed from the generated plasma.

Heretofore, remote plasma sources have been used to provide uniform exposure for entire substrates, and experimental studies of process variables have required dedicating an entire wafer to each process condition to be tested. What is needed is a system that allows systematic exploration of process variables in a combinatorial manner with many variations on a single substrate. The most promising process parameters can then be extended to the processing of entire substrates.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Methods and apparatus for processing using a remote plasma source are disclosed. The apparatus includes an outer chamber, a remote plasma source, and a showerhead. Inert gas ports within the showerhead assembly can be used to alter the concentration and energy (e.g. to quench) of reactive radical or reactive neutral species generated by the remote plasma source in different regions of the showerhead. This allows the showerhead to be used to apply a surface treatment to different regions of the surface of a substrate. Varying parameters such as the remote plasma parameters, the inert gas flows, pressure, and the like allow different regions of the substrate to be treated in a combinatorial manner. In some embodiments, the inert gas ports are not used, allowing the entire surface of the substrate to be treated in a uniform manner, using the same hardware.

Methods of surface exposure to a plasma or reactive radical species are provided. The methods comprise exposing a first region of a surface of a substrate to a plasma or reactive radical species from a remote plasma source under a first set of process parameters, exposing a second region of the surface of the substrate to a plasma or reactive radicals from a remote plasma source under a second set of process parameters, and varying the first set and second set of process parameters in a combinatorial manner. The first set and second set of process parameters include one or more of source gases for the plasma generator, plasma filtering parameters, exposure time, gas flow rate, frequency, plasma generator power, plasma generation method, chamber pressure, substrate temperature, distance between plasma source and substrate, substrate bias voltage, or combinations thereof. The exposing can be controlled by introducing a flow of an inert gas into different portions of the showerhead to alter the concentration and/or energy levels (e.g. to quench) of reactive species supplied by a remote plasma source. The exposing can further be controlled by a gas purge system that provides a flow of gas into the region through the small gap and out of the region through the aperture.

The method can be extended by exposing a third site-isolated region of the substrate to a plasma or reactive radical species from a remote plasma source under a third set of process parameters, and more generally, by exposing a plurality of regions of the substrate to a plasma or reactive radical species from a remote plasma source under a plurality of different sets of process parameters. The substrate can be analyzed to evaluate the effect of the different process parameters on the substrate. Plasma exposure process parameters can be varied in a combinatorial manner. Plasma exposure process parameters include one or more of source gases for the plasma generator, plasma filtering parameters, exposure time, gas flow rate, frequency, plasma generator power, plasma generation method, chamber pressure, substrate temperature, distance between plasma source and substrate, substrate bias voltage, or combinations thereof.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1:
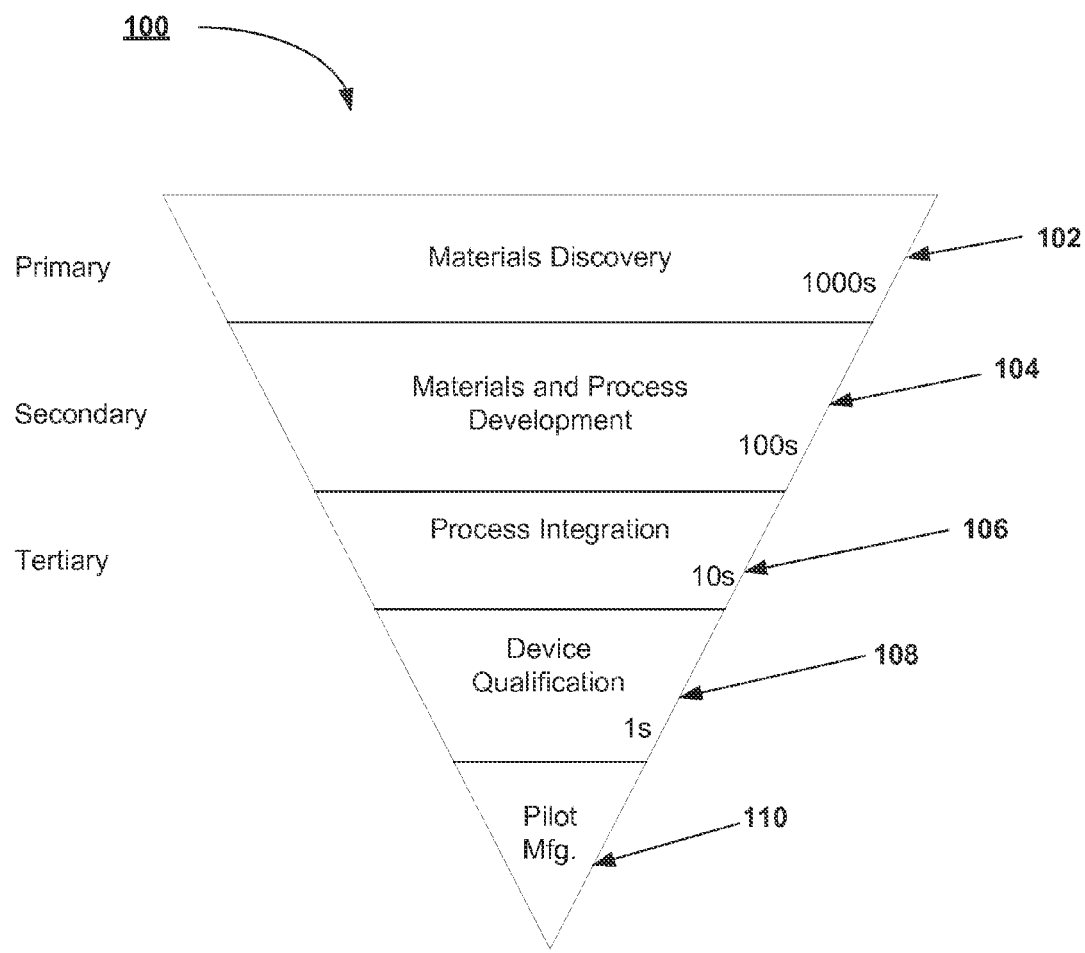
FIG. 1 illustrates a schematic diagram for implementing combinatorial processing and evaluation.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Before various embodiments are described in detail, it is to be understood that unless otherwise indicated, this invention is not limited to specific layer compositions or surface treatments. It is also to be understood that the terminology used herein is for the purpose of describing particular embodiments only and is not intended to limit the scope of the present invention.

It must be noted that as used herein and in the claims, the singular forms "a," "and" and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. The term "about" generally refers to ±10% of a stated value.

The term "site-isolated" as used herein refers to providing distinct processing conditions, such as controlled temperature, flow rates, chamber pressure, processing time, plasma composition, and plasma energies. Site isolation may provide complete isolation between regions or relative isolation between regions. Preferably, the relative isolation is sufficient to provide a control over processing conditions within ±10%, within ±5%, within ±2%, within ±1%, or within ±0.1% of the target conditions. Where one region is processed at a time, adjacent regions are generally protected from any exposure that would alter the substrate surface in a measurable way.

The term "site-isolated region" is used herein to refer to a localized area on a substrate which is, was, or is intended to be used for processing or formation of a selected material. The region can include one region and/or a series of regular or periodic regions predefined on the substrate. The region may have any convenient shape, e.g., circular, rectangular, elliptical, wedge-shaped, etc. In the semiconductor field, a region may be, for example, a test structure, single die, multiple dies, portion of a die, other defined portion of substrate, or an undefined area of a substrate, e.g., blanket substrate which is defined through the processing.

The term "substrate" as used herein may refer to any workpiece on which formation or treatment of material layers is desired. Substrates may include, without limitation, silicon, silica, sapphire, zinc oxide, SiC, AlN, GaN, Spinel, coated silicon, silicon on oxide, silicon carbide on oxide, glass, gallium nitride, indium nitride and aluminum nitride, and combinations (or alloys) thereof. The term "substrate" or "wafer" may be used interchangeably herein. Semiconductor wafer shapes and sizes can vary and include commonly used round wafers of 2", 4", 200 mm, or 300 mm in diameter.

The term "remote plasma source" as used herein refers to a plasma (e.g., an rf or microwave generated plasma) located at a distance from a deposition or treatment location sufficient to allow some filtering of the plasma components. For example, the density of ions and electrons can be adjusted by distance, and electrons and ions can also be filtered out using suitable electrode configurations, such as a grounded metal showerhead so that only atomic or molecular radicals reach the substrate.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD).

The present invention is described in one or more embodiments in the following description with reference to the Figures, in which like numerals represent the same or similar elements. While the invention is described in exemplary terms which include a best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Embodiments of the present invention provide a system for systematic exploration of plasma treatment process variables in a combinatorial manner with the possibility of performing many variations on a single substrate. The combinatorial processing permits a single substrate to be systematically explored using different plasma processing conditions, and reduces or eliminates variables that interfere with research quality. The apparatuses and methods disclosed herein permit the systematic exploration of plasma treatments on a single substrate using combinatorial methods, and removes the run to run variability and inconsistencies between substrates that hamper research and optimization of process variables.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention.

While the combinatorial processing varies certain materials, hardware details, or process sequences, the composition or thickness of the layers or structures or the actions, such as cleaning, surface preparation, deposition, surface treatment, etc. is substantially uniform through each discrete region. Furthermore, while different materials or processes may be used for corresponding layers or steps in the formation of a structure in different regions of the substrate during the combinatorial processing, the application of each layer or use of a given process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
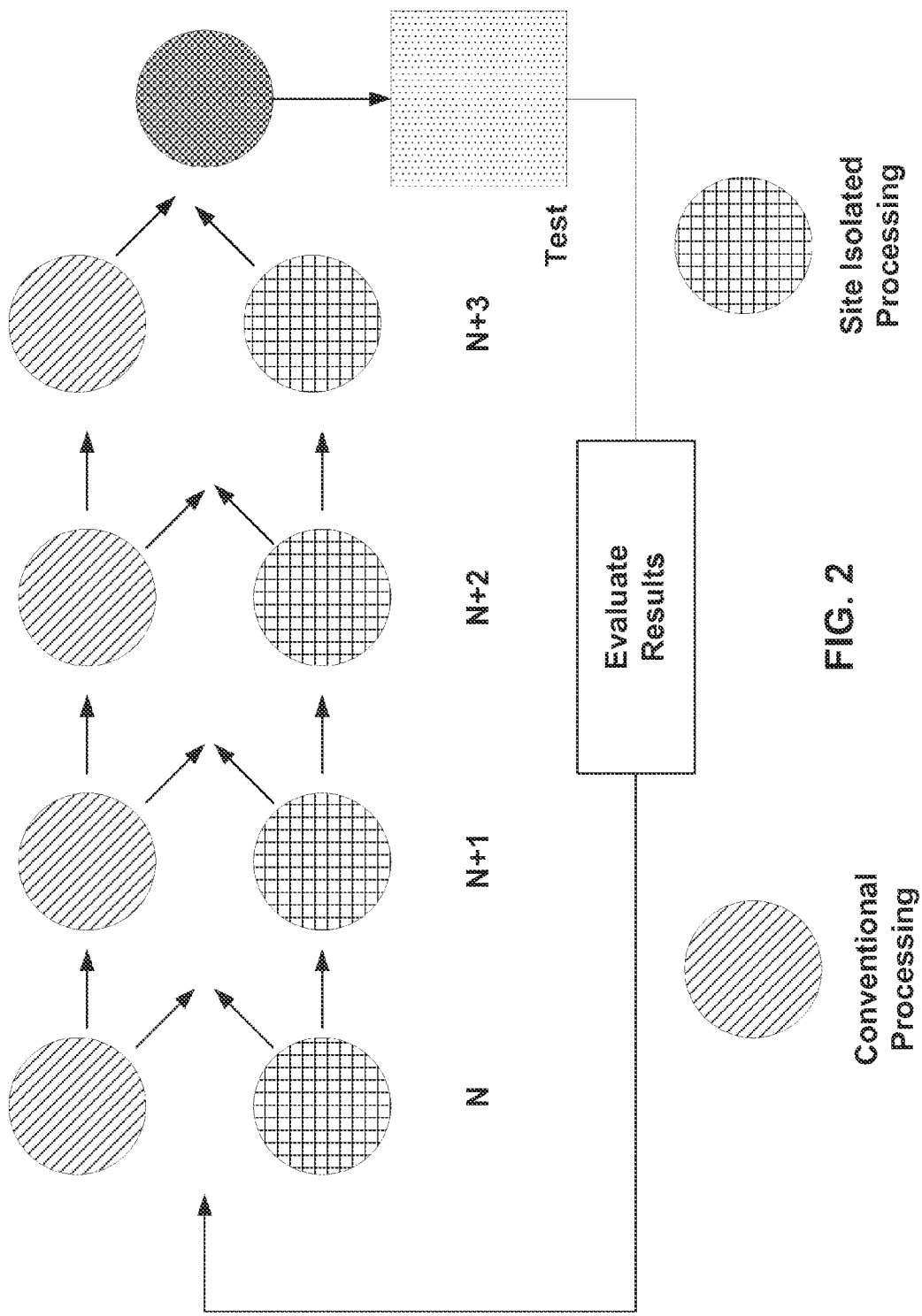
FIG. 2 presents a schematic diagram for illustrating various process sequences using combinatorial processing and evaluation.

FIG. 2 is a simplified schematic diagram illustrating a general methodology for combinatorial process sequence integration that includes site-isolated processing and/or conventional processing in accordance with one embodiment of the invention. In one embodiment, the substrate is initially processed using conventional process N. In one exemplary embodiment, the substrate is then processed using site-isolated process N+1. During site-isolated processing, an HPC module may be used, such as the HPC module described in U.S. patent application Ser. No. 11/352,077 filed on Feb. 10, 2006. The substrate can then be processed using site-isolated process N+2, and thereafter processed using conventional process N+3. Testing is performed and the results are evaluated. The testing can include physical, chemical, acoustic, magnetic, electrical, optical, etc. tests. From this evaluation, a particular process from the various site-isolated processes (e.g. from steps N+1 and N+2) may be selected and fixed so that additional combinatorial process sequence integration may be performed using site-isolated processing for either process N or N+3. For example, a next process sequence can include processing the substrate using site-isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above process flows can be applied to entire monolithic substrates, or portions of the monolithic substrates.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, the order in which materials are deposited, hardware details of the gas distribution assembly, etc. It should be appreciated that these process parameters are exemplary and not meant to be an exhaustive list as other process parameters commonly used with remote plasma exposure systems may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Substrates may be a conventional round 200 mm, 300 mm, or any other larger or smaller substrate/wafer size. In other embodiments, substrates may be square, rectangular, or other shape. One skilled in the art will appreciate that substrate may be a blanket substrate, a coupon (e.g., partial wafer), or even a patterned substrate having predefined regions. In some embodiments, a substrate may have regions defined through the processing described herein.

Software is provided to control the process parameters for each wafer for the combinatorial processing. The process parameters comprise selection of one or more source gases for the plasma generator, plasma filtering parameters, exposure time, substrate temperature, power, frequency, plasma generation method, substrate bias, pressure, gas flow, or combinations thereof.

Figure 3:
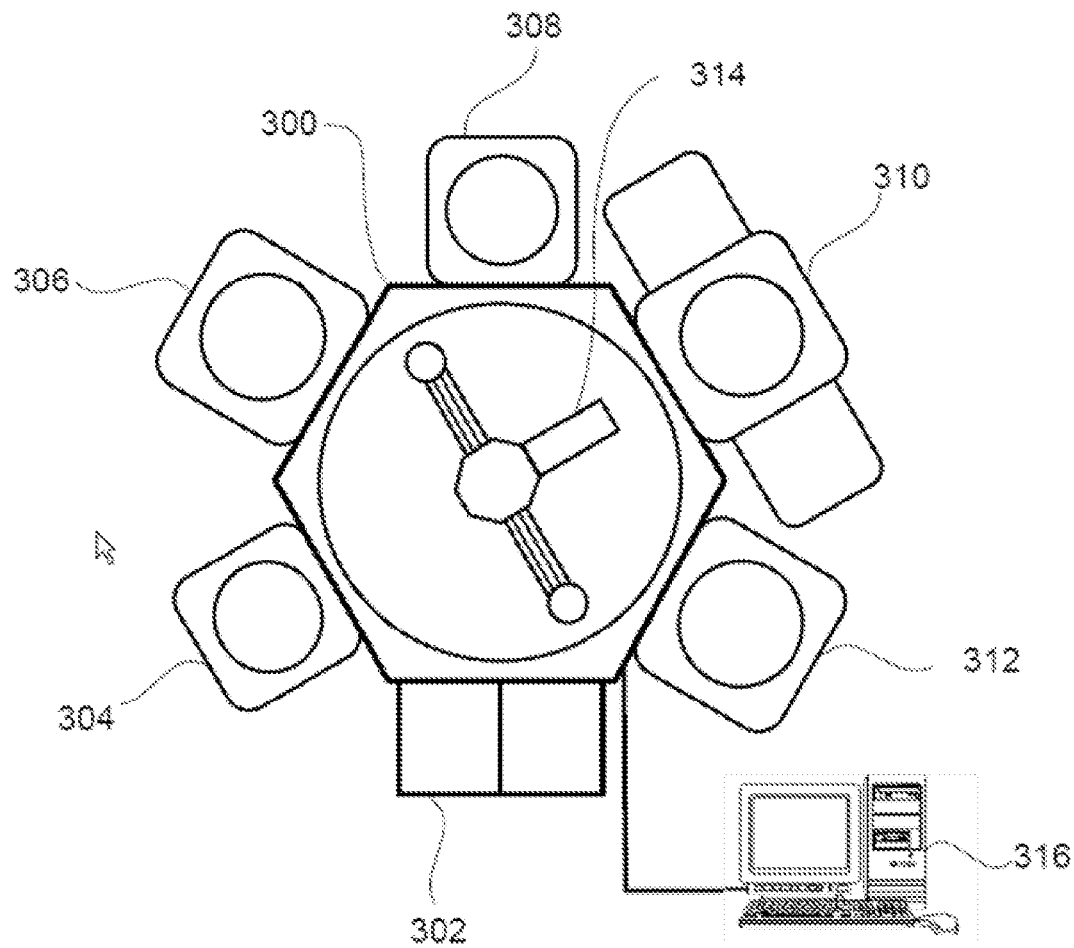
FIG. 3 illustrates a processing system enabling combinatorial processing.

FIG. 3 is a simplified schematic diagram illustrating an integrated high productivity combinatorial (HPC) system in accordance with some embodiments of the invention. The HPC system includes a frame 300 supporting a plurality of processing modules. It will be appreciated that frame 300 may be a unitary frame in accordance with some embodiments. In some embodiments, the environment within frame 300 is controlled. A load lock 302 provides access into the plurality of modules of the HPC system. A robot 314 provides for the movement of substrates (and masks) between the modules and for the movement into and out of the load lock 302. Modules 304-312 may be any set of modules and preferably include one or more combinatorial modules. For example, module 304 may be an orientation/degassing module, module 306 may be a clean module, either plasma or non-plasma based, modules 308 and/or 310 may be combinatorial/conventional dual purpose modules. Module 312 may provide conventional clean or degas as necessary for the experiment design.

Any type of chamber or combination of chambers may be implemented and the description herein is merely illustrative of one possible combination and not meant to limit the potential chamber or processes that can be supported to combine combinatorial processing or combinatorial plus conventional processing of a substrate or wafer. In some embodiments, a centralized controller, i.e., computing device 316, may control the processes of the HPC system. Further details of one possible HPC system are described in U.S. application Ser. Nos. 11/672,478 and 11/672,473, the entire disclosures of which are herein incorporated by reference. In a HPC system, a plurality of methods may be employed to deposit material upon a substrate employing combinatorial processes.

Plasmas are widely used for a variety of treatment and layer deposition tasks in semiconductor fabrication. These applications include subtractive processes such as wafer precleaning, contaminant removal, native oxide removal, photoresist removal, as well as treatment processes such as oxidation, nitridation, or hydridation of a layer both during and after formation. "Remote" plasma sources are frequently used, where the plasma is located at some distance from the surface to be treated or substrate on which a layer is to be formed. The distance allows some adjusting of the charged particles in the plasma. For example, the density of ions and electrons can be adjusted by distance, the electrons and ions can be removed from the generated plasma using suitable electrode configurations such as a grounded metal showerhead, so that, for example, only atomic radicals and molecule radicals (but not ions) reach the substrate.

The plasma generator for a remote plasma source can use any known means of coupling energy into atoms or molecules to ionize them and create a plasma. The energy source can be, for example, electromagnetic energy such as microwaves, radio frequency energy, or lasers.

Typically, systems using remote plasma sources were designed to treat the entire area of a substrate, such as a 300 mm wafer. Combinatorial processing is difficult and expensive when the entire area of a substrate can only receive a single process variation. Some embodiments of the present invention overcome this limitation by providing a remote plasma source, an associated substrate positioning system, and a site isolation system that allows a selected region of a substrate to be processed while the remaining regions of the substrate are protected from exposure to the plasma and reactive radical species unless or until such exposure is intended.

Accordingly, an apparatus for combinatorial processing using remote plasma exposure of a substrate is disclosed. The apparatus comprises an outer chamber containing: a remote plasma source, a showerhead, and a transport system comprising a substrate support and capable of positioning the substrate. Inert gas ports within the showerhead assembly can be used to alter the concentration and energy (e.g. to quench) of reactive radical or reactive neutral species generated by the remote plasma source in different regions of the showerhead. This allows the showerhead to be used to apply a surface treatment to different regions of the surface of a substrate. The plasma exposure process parameters can be varied in a combinatorial manner. The plasma exposure process parameters comprise one or more of source gases for the plasma generator, plasma filtering parameters, exposure time, gas flow rate, frequency, plasma generator power, plasma generation method, chamber pressure, substrate temperature, distance between plasma source and substrate, substrate bias voltage, or combinations thereof.

Figure 4:
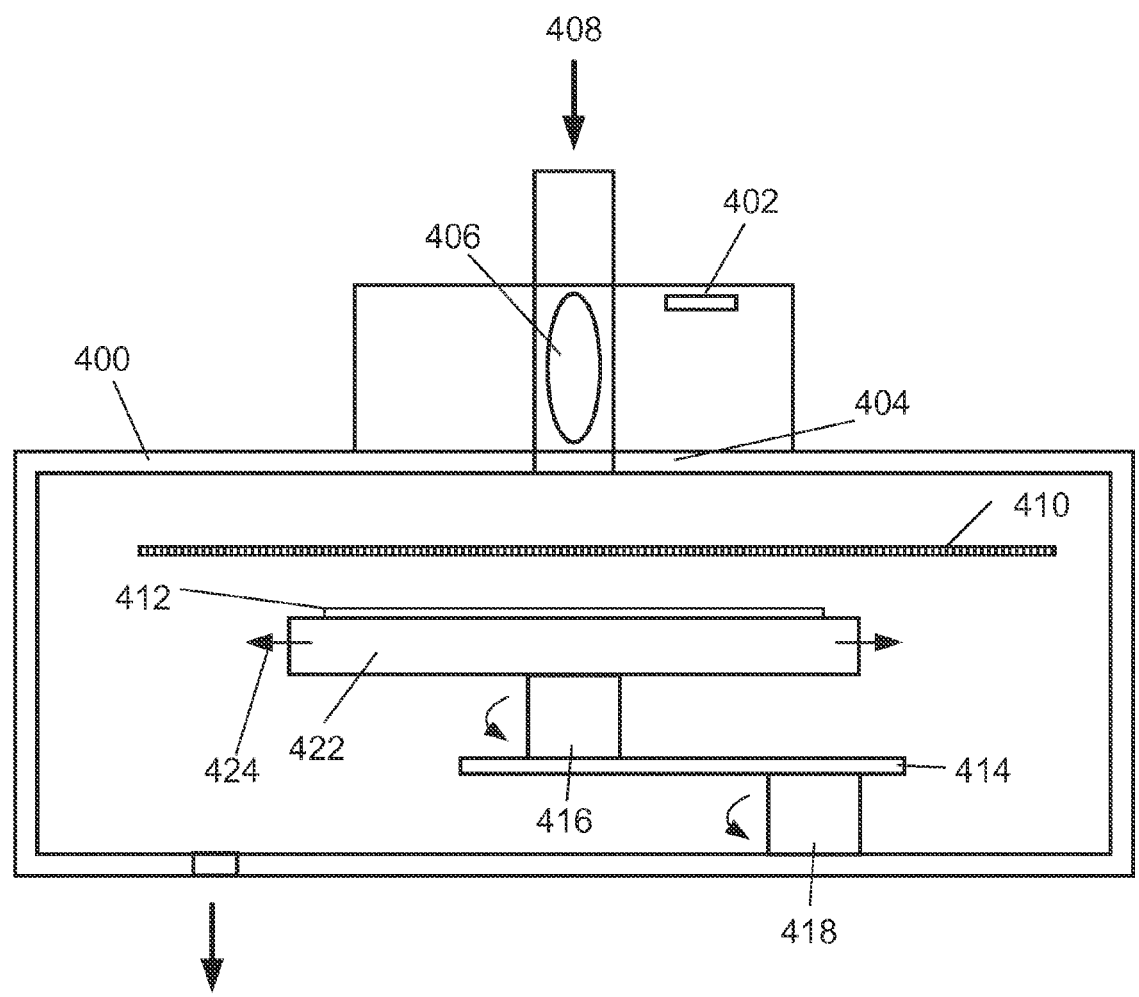
FIG. 4 illustrates an apparatus enabling combinatorial processing using a remote plasma source.

FIG. 4 illustrates the overall layout of some embodiments of a system enabling combinatorial processing using a remote plasma source. A discussion of the system may be found in co-owned U.S. patent application Ser. No. 13/328,129 filed on Dec. 16, 2011 which is herein incorporated by reference for all purposes. Portions of the '129 application are included herein to enhance the understanding of the present disclosure. A process chamber 400 is provided. A remote plasma source 402 is mounted on a chamber lid 404 either directly as illustrated or through a short flange. The plasma 406 is entrained into a central gas flow 408 which is directed toward a showerhead 410. The showerhead is disposed within the processing chamber between the remote plasma source and the substrate and is in close proximity to the substrate 412. The showerhead further includes multiple regions, each region containing an inert gas port. The showerhead is operable to provide exposure of reactive species from the remote plasma source to regions of the substrate. A substrate positioning system 414 can position the substrate 412 directly under the showerhead 410. As illustrated in FIG. 4, the substrate positioning system can provide two displaced axes of rotation 416 and 418. The two-axis rotation configuration illustrated can provide 360° of rotation for the upper rotation (providing an angular coordinate) and 60° of rotation for the lower axis (approximating a radial coordinate) to provide all possible substrate positions. Alternatively, other positioning systems such as X-Y translators can also be used. In addition, substrate support 422 may move in a vertical direction. It should be appreciated that the rotation and movement in the vertical direction may be achieved through known drive mechanisms which include magnetic drives, linear drives, worm screws, lead screws, a differentially pumped rotary feed through drive, etc.

The substrate support 422 can include a substrate heater (e.g., resistive or inductive) and can be sized to be larger than the largest substrate to be processed. Substrate temperatures for most remote plasma applications are less than 500 C, although any suitable heater power and range of temperature control. The substrate support 422 can also be configured to provide a gas purge flow 424, for example from the edges of the support, using argon, helium, or any other gas that is not reactive under the process conditions.

The showerhead shape and size can be varied according to the needs of particular combinatorial experiments. Typical shapes are round, square, or rectangular. The showerhead may be divided into sections (e.g. quadrants, eighths, or the like). Further experimental design flexibility can be provided by using patterned showerheads with multiple hole configurations.

Figure 5:
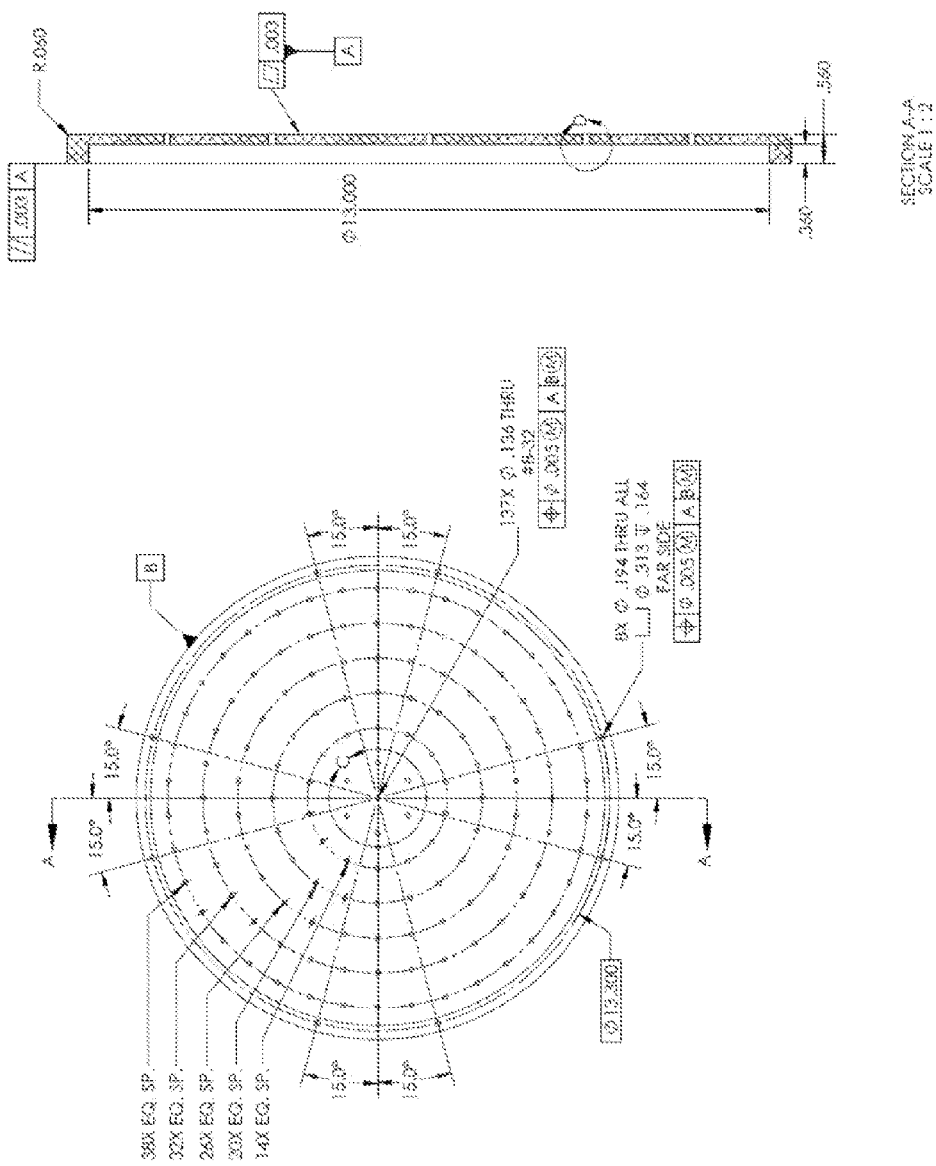
FIG. 5 illustrates a schematic diagram for plasma surface treatment according to some embodiments.

FIG. 5 illustrates a top-down view of the showerhead according to some embodiments. The showerhead generally includes a plurality of through holes configured in concentric rings. However, those skilled in the art will understand that any useful configuration of holes may be used. The showerhead illustrated in FIG. 5 is designed to expose the entire substrate to the reactive species generated by the plasma. However, the showerhead may be a segmented showerhead wherein different gases are conveyed to different segments of the showerhead. Segmented showerheads are disclosed in co-owned U.S. patent application Ser. No. 12/433,842, filed on Apr. 30, 2009, now U.S. Pat. No. 8,129,288, which claims priority to U.S. Provisional Patent Application No. 61/050,159, filed on May 2, 2008, and co-owned U.S. patent application Ser. No. 13/302,730, filed on Nov. 22, 2011, each of which are herein incorporated by reference for all purposes.

The plasma, 406, in FIG. 4 will generate ions, electrons, radicals, and reactive neutral species. As used herein, a reactive neutral species will be understood to include atomic or molecular radicals as well as atoms or molecules that are in an excited electronic or vibrational state. Examples of reactive species may include atomic N, O, F, Cl, H, and excited molecular species of $O_2$, $O_3$, $N_2$, $NH_3$, $NF_3$, $Cl_2$, $HCl$, $H_2$, $H_2O$, and the like. These species (charged and neutral) may be directed to the surface of the substrate through the showerhead. The showerhead serves to evenly distribute the species across the surface of the substrate. In some embodiments, electric or magnetic fields may be used to remove the ions and electrons from the flow that is incident on the surface of the substrate. The removal of charged species can decrease damage to devices formed on the surface of the substrate.

Figure 6:
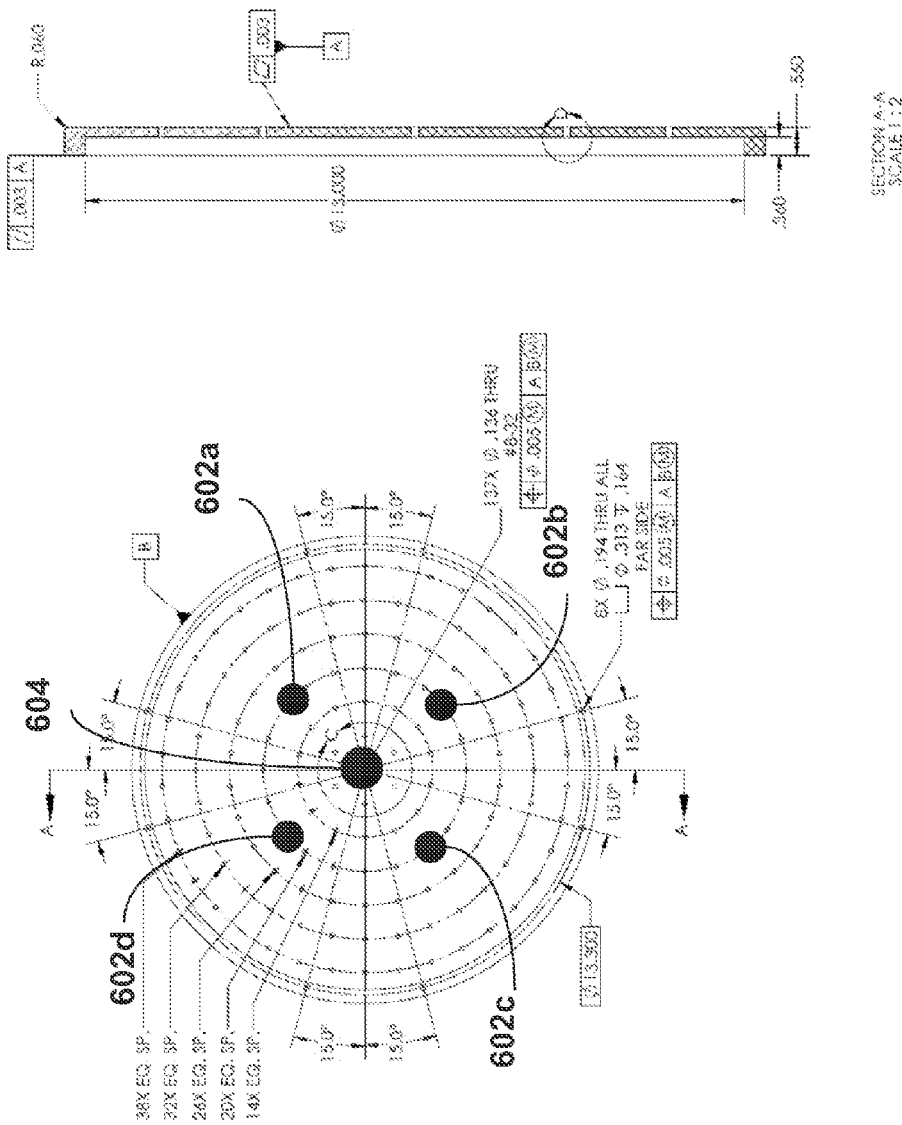
FIG. 6 illustrates a schematic diagram for plasma surface treatment according to some embodiments.

FIG. 6 illustrates a top-down view of the showerhead according to some embodiments. The showerhead generally includes a plurality of through holes configured in concentric rings. However, those skilled in the art will understand that any useful configuration of holes may be used. The showerhead illustrated in FIG. 6 is designed to expose the entire substrate to the reactive species generated by the plasma. However, the showerhead may be a segmented showerhead wherein different gases are conveyed to different regions of the showerhead as discussed previously. The showerhead illustrated in FIG. 6 further includes a plurality of inert gas ports, 602a-602d. Although four ports are illustrated in FIG. 6, those skilled in the art will understand that any number of ports may be employed to effectively divide the showerhead into any number of segments. Specific numbers of segments that are of practical use include 2, 4, 6, 8, and 12. Inert gases can be introduced into these ports to dilute and/or quench the reactive species (both charged and neutral) incident on the surface of the substrate. Each of the inert gas ports may have an independent valve and gas delivery system for individual control. Examples of inert gases include He, Ne, Ar, Kr, Xe, and the like. Other gases that can be introduced to quench the reactive species include $N_2$, $O_2$, and $H_2$. Energy is transferred from the reactive species, thereby making them less likely to interact strongly with the surface of the substrate. In this manner, the exposure of some regions of the substrate to reactive species can be quenched while other regions of the substrate can be exposed to the reactive species. Therefore, the concentration of reactive species incident on the various regions of the substrate can be modulated by the magnitude and the composition of the inert gas flow introduced through the various ports.

In some embodiments, methods of combinatorially varying surface exposure to a plasma or reactive radical species are provided. The methods comprise exposing a first region of a substrate to a plasma or reactive radical species from a remote plasma source under a first set of process parameters, and exposing a second region of the substrate to a plasma or reactive radical species from a remote plasma source under a second set of process parameters. During plasma exposure, the remaining area (the unexposed area) of the substrate is protected from exposure to the plasma or reactive radicals. The remaining areas are protected by introducing a flow of inert gas into those portions of the showerhead, effectively quenching the reactive species. Therefore, the species will not interact with the substrate surface. The process parameters can be varied in a combinatorial manner. Typically, the process parameters comprise one or more of source gases for the plasma generator, plasma filtering parameters, exposure times, gas flow rates, frequencies, plasma generator powers, plasma generation methods, chamber pressures, substrate temperatures, distances between plasma source and substrate, substrate bias voltages, inert gas flow, or combinations thereof.

The region of the substrate is exposed to a plasma or reactive radical species through a showerhead in a process chamber. As shown in an embodiment in FIG. 4, the showerhead is parallel to the substrate.

The methods can further comprise exposing a third region of the substrate to a plasma or reactive radical species from a remote plasma source under a third set of process parameters. The exposing of regions of the substrate to a plasma or reactive radical species under different process parameters can be repeated until the desired process parameters have been evaluated, (i.e., by exposing a plurality of site-isolated regions of the substrate to a plasma or reactive radical species from a remote plasma source under a plurality of sets of process parameters). After a desired number of regions of the substrate have been exposed to plasma under different processing parameters, the substrate is analyzed to evaluate the effect of the different process parameters on the substrate.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for surface exposure to a plasma or reactive radical species, the method comprising:
   generating a flow of reactive species using a remote plasma source;
   passing the flow of reactive species through holes in a showerhead, the showerhead comprising a plurality of regions, each of the showerhead regions further comprising an inert gas port wherein each inert gas port only dispenses inert gases therethrough to a substrate;
   wherein the showerhead is operable to provide exposure of the reactive species from the remote plasma source to a region on the substrate; and
   flowing inert gas through at least two or more of the inert gas ports, wherein the flowing of inert gas is operable to quench reactive species within the corresponding regions of the showerhead;
   wherein flowing the inert gas is varied in a combinatorial manner through at least two of the inert gas ports;
   wherein to quench includes altering the concentration or energy level of the flow of reactive species.

2. The method of claim 1, wherein a first region of the substrate is exposed to reactive species using a first set of process parameters and a second region of the substrate is exposed to the flow of reactive species using a second set of process parameters.

3. The method of claim 2, wherein the first set and the second set of process parameters each comprise at least one of source gases for the plasma generator, plasma filtering parameters, exposure time, gas flow rate, frequency, plasma generator power, plasma generation method, chamber pressure, substrate temperature, distance between plasma source and substrate, substrate bias voltage, inert gas flow, or combinations thereof.

4. The method of claim 2, further comprising exposing a third region of the substrate to the flow of reactive species using a third set of process parameters.

5. The method of claim 1, further comprising exposing a plurality of regions of the substrate to the flow of reactive species from a remote plasma source under a plurality of different sets of process parameters.

6. The method of claim 5, wherein the sets of process parameters can be varied in a combinatorial manner.

7. The method of claim 1, wherein the substrate is analyzed to evaluate the effect of the different sets of process parameters on the substrate.

8. The method of claim 1, wherein the inert gas is at least one of He, Ne, Ar, Kr, Xe, N2, O2, or H2.

9. The method of claim 1 further comprising quenching the reactive species in only one of the plurality of regions of the showerhead.

* * * * *